United States Patent
Wickboldt et al.

(10) Patent No.: US 6,436,739 B1
(45) Date of Patent: Aug. 20, 2002

(54) THICK ADHERENT DIELECTRIC FILMS ON PLASTIC SUBSTRATES AND METHOD FOR DEPOSITING SAME

(75) Inventors: Paul Wickboldt, Walnut Creek; Albert R. Ellingboe, Fremont, both of CA (US); Steven D. Theiss, Woodbury, MN (US); Patrick M. Smith, San Ramon, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/560,058

(22) Filed: Apr. 27, 2000

(51) Int. Cl.$^7$ .......................... H01L 21/84; H01L 21/00
(52) U.S. Cl. ................... 438/149; 438/151; 438/166
(58) Field of Search ..................... 438/149, 151, 438/152, 166

(56) References Cited

U.S. PATENT DOCUMENTS

| | | | | |
|---|---|---|---|---|
| 4,855,017 A | * | 8/1989 | Douglas | 156/643 |
| 5,082,542 A | * | 1/1992 | Moslehi et al. | 204/192.32 |
| 5,310,453 A | * | 5/1994 | Fukasawa et al. | 156/643 |
| 5,320,982 A | * | 6/1994 | Tsubone et al. | 437/228 |
| 5,334,454 A | | 8/1994 | Caporiccio et al. | |
| 5,382,311 A | * | 1/1995 | Ishikawa et al. | 156/345 |
| 5,395,645 A | * | 3/1995 | Kodera et al. | 427/126.1 |
| 5,489,336 A | * | 2/1996 | Kodera et al. | 118/404 |
| 5,538,758 A | * | 7/1996 | Beach et al. | 427/255.6 |
| 5,817,550 A | | 10/1998 | Carey et al. | |
| 5,846,608 A | | 12/1998 | Neumann et al. | |
| 6,207,472 B1 | * | 3/2001 | Callegari et al. | 438/99 |

FOREIGN PATENT DOCUMENTS

| | | |
|---|---|---|
| DE | 19612345 C1 | 1/1997 |
| EP | 0311302 A1 | 9/1988 |
| EP | 0887437 A2 | 6/1998 |

OTHER PUBLICATIONS

Rostaing et al., Highly homogeneous silica coatings for optical and protective applications deposited by PECVD at room temperature in a planar uniform distruvuted electron cyclotron resonance plasma reactor. Thin Solid Films 270 (1995) 49–54. 1995 Elsevier Science S.A.

* cited by examiner

Primary Examiner—Michael S. Lebentritt
(74) Attorney, Agent, or Firm—L.E. Carnahan; Alan H. Thompson

(57) ABSTRACT

Thick adherent dielectric films deposited on plastic substrates for use as a thermal barrier layer to protect the plastic substrates from high temperatures which, for example, occur during laser annealing of layers subsequently deposited on the dielectric films. It is desirable that the barrier layer has properties including: a thickness of 1 $\mu$m or greater, adheres to a plastic substrate, does not lift-off when cycled in temperature, has few or no cracks and does not crack when subjected to bending, resistant to lift-off when submersed in fluids, electrically insulating and preferably transparent. The thick barrier layer may be composed, for example, of a variety of dielectrics and certain metal oxides, and may be deposited on a variety of plastic substrates by various known deposition techniques. The key to the method of forming the thick barrier layer on the plastic substrate is maintaining the substrate cool during deposition of the barrier layer. Cooling of the substrate maybe accomplished by the use of a cooling chuck on which the plastic substrate is positioned, and by directing cooling gas, such as He, Ar and $N_2$, between the plastic substrate and the cooling chucks. Thick adherent dielectric films up to about 5 $\mu$m have been deposited on plastic substrates which include the above-referenced properties, and which enable the plastic substrates to withstand laser processing temperatures applied to materials deposited on the dielectric films.

17 Claims, 4 Drawing Sheets

THICK ADHERENT DIELECTRIC FILMS ON PLASTIC SUBSTRATES AND METHOD FOR DEPOSITING SAME

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to forming thin film transistors, particularly to forming silicon thin film devices on plastic substrates, and more particularly to forming a thick adherent dielectric film intermediate a plastic substrate and a silicon thin film device which protects the plastic substrate during laser processing of the device.

Development efforts are underway for the fabrication of silicon thin film transistors, for example, on plastic substrates to produce lightweight devices. These development efforts have been focused on manufacturing polycrystalline silicon (poly-Si) based thin film transistors at low temperatures on plastic substrates. Two technical hurdles that must be overcome are to manufacture and to dope a poly-Si film while preventing any thermal damage to the plastic substrate, which generally cannot withstand sustained temperatures over about 200° C. Conventional processes to produce or dope poly-Si require sustained temperatures at or above 600° C., a temperature range that will damage plastics.

By the use of pulsed laser annealing to produce poly-Si, as described and claimed in U.S. Pat. No. 5,817,550, issued Oct. 6, 1998 to Paul C. Carey, et al., which involves using a high intensity ultraviolet excimer laser pulse that is absorbed at the surface of the silicon film, thermal damages to most plastic substrates was significantly reduced. The pulse energy is sufficient to heat the silicon film to its melting point (~1400° C.), but the time period of the pulse was short so as not to significantly heat the plastic substrate.

Efforts to fully resolve the above-referenced hurdles were directed to the formation of a thermal barrier layer between the silicon film and the plastic substrate, which serves to dissipate the heat so that the plastic substrate is not exposed to high temperatures that would damage the plastic. These efforts, for example, involved a conventional PECVD deposition technique to deposit a film of silicon dioxide, $SiO_2$, at 100° C. for use as the thermal barrier. The thicknest film that could be achieved using this method was 0.75 $\mu$m. Films greater than 0.75 $\mu$m deposited by this method would easily crack when subjected to bending, and indicated very high stresses. Efforts to deposit thicker non-cracking films by varying the deposition conditions failed. Following this, commercially available materials were sought from the film coating industry. Thick (2–4 $\mu$m) films of commercially available VITRINITE, made by MetroLine, were deposited on plastic substrates. While use of these thermal barrier layers resulted in few cracks during the silicon processing, they immediately cracked and delaminated when submersed in water, a necessary requirement for the poly-Si processing. Other commercially available films also delaminated and cracked when exposed to water. As the result of the unavailability of thermal barrier films, and since the above-referenced 0.75 $\mu$m $SiO_2$ film was not sufficiently thick to fully protect the plastic substrate during poly-Si processing, even utilizing pulsed laser processing, there was a need for a thermal barrier film having a thickness of 1–5 $\mu$m, preferably ~4–5 $\mu$m, and with the following properties; 1) adheres to plastic substrates, 2) does not lift-off when cycled in temperature, 3) has no cracks and does not crack when subject to bending, 4) resistant to lift-off when submersed in fluids, 5) electrically insulating, and 6) preferably transparent.

The present invention provides a solution to the above-referenced technical hurdles and provides thick adherent dielectric films having the above-listed properties which can be composed of various materials and deposited on the plastic substrate by various known deposition techniques. This is accomplished by cooling the plastic substrate during deposition of the thermal barrier layer to near room temperature by use of a cooling chuck. The method for producing the thick (1–5 $\mu$m) adherent dielectric film includes directing cooling gases between the plastic substrate and the cooled substrate retaining chuck.

SUMMARY OF THE INVENTION

It is an object of the present invention to provide a plastic substrate with an adherent thick (1–5 $\mu$m) dielectric film.

A further object of the invention is to provide a method for depositing adherent dielectric films on plastic substrates which includes cooling the substrate during deposition of the films.

Another object of the invention is to provide a plastic substrate with a thermally protective film to enable processing of components at temperatures that would normally damage the plastic substrate.

Another object of the invention is to deposit thermal barrier layers on plastic substrates and deposit material to be processed on the thermal barrier layer, whereby the plastic substrates are protected from high temperatures which occur during laser annealing of the material deposited on the thermal barrier layer.

Another object of the invention is to provide a thermal barrier layer of plastic substrates which adheres to the plastic substrates, has a thickness of 1 $\mu$m or greater, does not lift-off when cycled in temperature, has essentially no cracks and does not crack when subjected to bending, is resistant to lift-off when submerged in fluids, is electrically insulating, and is preferably transparent.

Other objects and advantages of the present invention may become apparent from the following description and accompanying drawings. The invention involves a thick, adherent, dielectric film deposited between a plastic substrate and one or more layers of material to be processed at temperatures that would damage the plastic substrate but for the dielectric film. The film may have a thickness of 1–5 $\mu$m, preferably 4–5 $\mu$m and may be formed from a variety of dielectrics by a variety of deposition techniques. Films deposited using the process of this invention can be used for a variety of applications, including but not limited to: use as a thermal barrier layer for laser annealing, use as a permeation/diffusion barrier, as a field dielectric for the electrical isolation of devices, a planarization layer, scratch resistant layers, and as a thermal/electrical insulation layer between device layers in multilevel circuitry. By the deposition of the thick dielectric layer, composed for example of $SiO_2$, between a plastic substrate, such as PET, by PECVD, and one or more layers of polycrystalline silicon, the sustained temperature of 600° C. or above, (pulsed temperature in the silicon layer of 1400° C.) conventionally utilized a laser annealing process or to dope the polycrystalline silicon, does not damage the plastic substrate in that the dielectric layer dissipates the heat so that the plastic substrate is not exposed to high temperatures. The deposition of the dielectric film is carried out using active cooling of the plastic substrate wherein the substrate is placed on a cooling chuck or mandrel and a cooling gas is directed between the cooling chuck and the substrate, such that, for example, the plastic substrate is maintained at about room temperature during deposition of the thick (1–5 μm) dielectric film.

DESCRIPTION OF THE DRAWINGS

The accompanying drawings, which are incorporated into and form a part the disclosure, illustrate embodiments of the invention and, together with the description, serve to explain the principles of the invention.

DETAILED DESCRIPTION OF THE INVENTION

The present invention is directed to a thermal barrier layer deposited intermediate a plastic substrate and one or more layers to be processed at sustained temperatures which would damage the plastic substrate, and to a method for depositing the thermal barrier layer on the plastic substrate. During deposition of the thermal barrier layer the plastic substrate is maintained at a low temperature, such as room temperature, by cooling during deposition. Cooling of the plastic substrate during deposition of the thermal barrier layer is carried out using a cooling chuck and directing a cooling gas intermediate the chuck and the plastic substrate. For example, the deposition of the thermal barrier layer is carried out using a helicon plasma source to deposit $SiO_2$ by PECVD on PET (polyethyleneterephthalate) plastic using helium (He) gas as the cooling gas directed from the center of a cooling chuck outwardly between the chuck and the plastic substrate. Thermal barrier layers of up to 5 μm have been deposited on plastic substrates which: 1) adheres to the substrate, 2) does not lift-off when cycled in temperature, 3) has essentially no cracks and does not crack when subjected to bending, 4) is resistant to lift-off when submersed in fluids, 5) is electrically insulating, and 6) is preferably transparent. The critical feature of the deposition process of this invention is actively cooling the substrate during deposition. This is accomplished by thermally coupling the substrate to a cooled substrate chuck or platform by flowing a cooling gas, such as He, Ar, Ne, between the substrate and the platform.

This process can be used for the deposition of dielectrics, such as $SiO_x$, $SiN_x$, $SiC_x$, $SiC_xO_y$, $Al_2O_3$, and MgO, using deposition techniques, such as evaporation, sputtering or reactive sputtering, PECVD using ECR, helicon, rf, dc or arc jet plasma sources, on plastic substrates, such as PET, PEN, KAPTON, etc. Experiment tests have shown that the process of this invention can produce transparent thermal barrier layers as thick as 5 μm from $SiO_x$ and $SiN_x$.

A critical component of this invention is the thick thermal barrier layer between a plastic substrate and one or more layers of silicon to be processed. This thermal barrier serves to dissipate the heat so that the plastic substrate is not exposed to high temperatures that would otherwise damage the plastic substrate, and the thermal barrier is deposited while the plastic substrate is maintained at a low temperature, such as room temperature by an active cooling operation.

As pointed out above, the thicknest previously deposited film that met the above-test requirements was 0.75 μm thick which was insufficient to protect plastic substrates during laser melting of silicon during laser annealing, thus by the process of this invention, plastic substrates can be protected by a variety of thick dielectric films deposited by a variety of deposition techniques.

Figure 1:
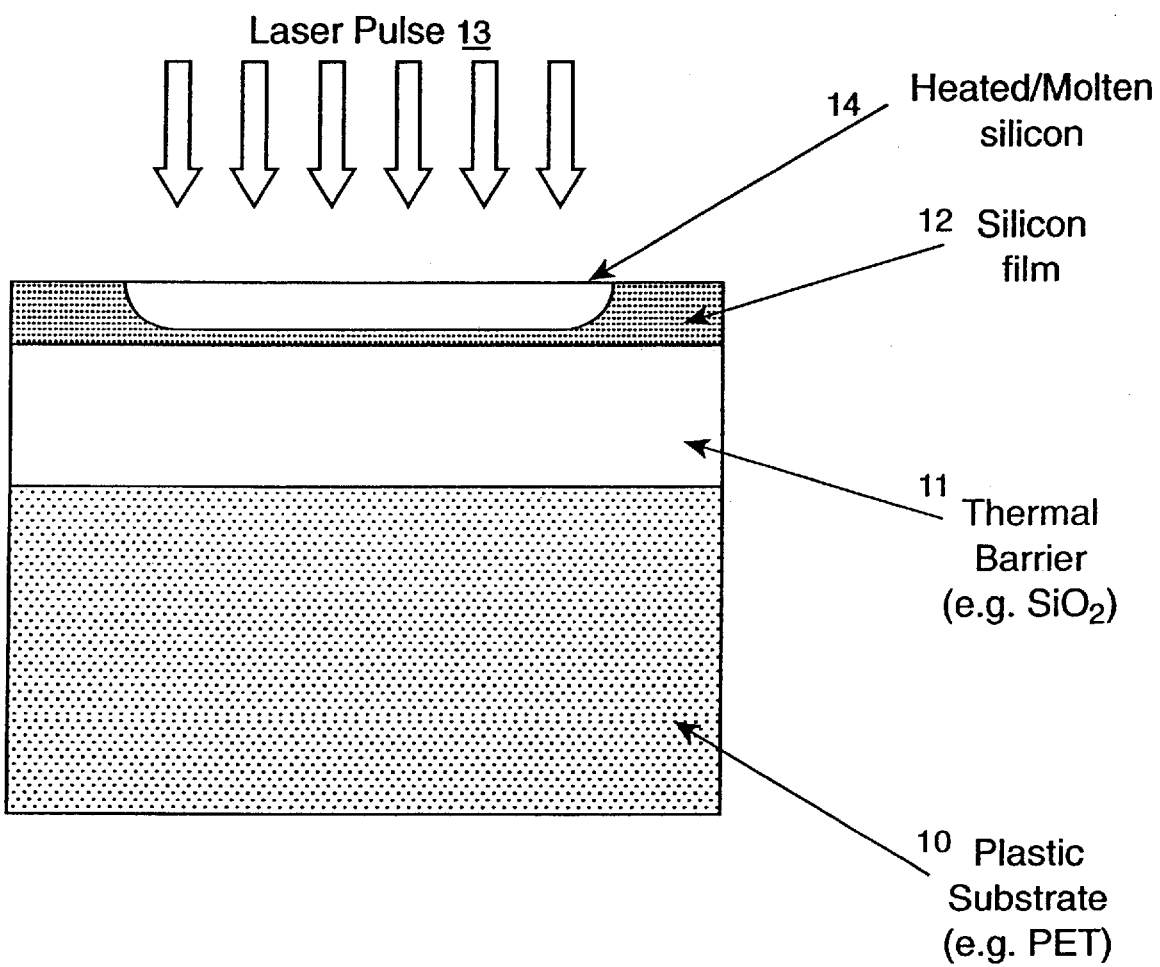
FIG. 1 illustrates laser annealing of a silicon film on a plastic substrate with a thermal barrier located between the substrate and the silicon film.

Referring now to the drawings, FIG. 1 illustrates an example of laser annealing of silicon film on a plastic substrate utilizing the thermal barrier of the present invention. As shown, a plastic substrate 10 (e.g., PET) has a thermal barrier 11 (e.g., $SiO_2$) deposited thereon, and a silicon film 12 is deposited on the thermal barrier 11. One or more laser pulses (e.g., excimer laser) indicated at 13 is directed onto the silicon film 12 producing heated/molten silicon 14. The laser pulse is sufficient to heat the silicon film to its melting point (~1400° C.). The thermal barrier 11 serves to dissipate the heat so that the plastic substrate 10 is not exposed to high temperatures that would damage the plastic. Generally plastic substrates should not be heated above about 200° C. for a sustained time period. Tests have shown that the thicker the thermal barrier becomes, the lower is the maximum temperature experienced by the plastic substrate. Therefore, it is desirable to deposit a thermal barrier of (1–5 μm) preferable greater than about 4 μm. This has been successfully carried out utilizing the method described hereinafter.

Figure 2:
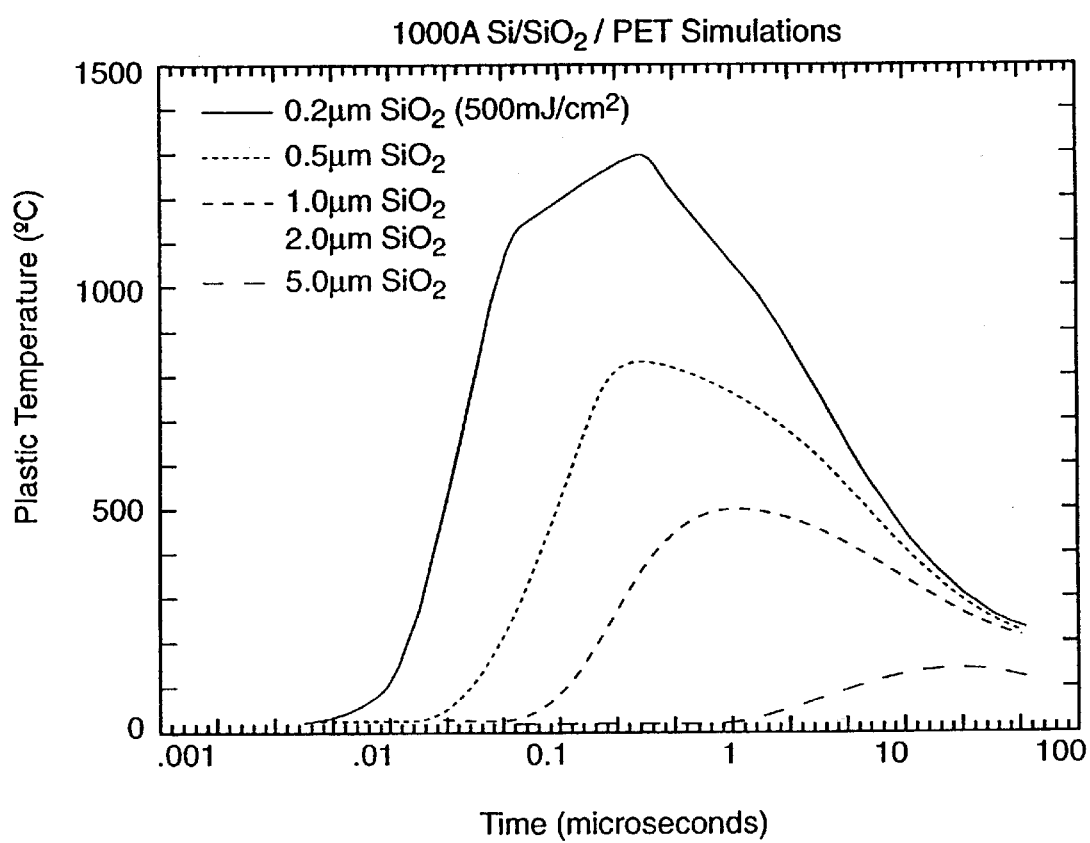
FIG. 2 graphically illustrates the results of a typical simulation of temperatures vs. time (temperature at plastic surface) during the laser annealing of silicon, as in FIG. 1, utilizing different thermal barrier thicknesses.

FIG. 2 illustrates results of a typical simulation of temperature vs. time during the laser annealing of silicon, illustrated in FIG. 1. The thermal barrier is assumed to be $SiO_2$, the plastic substrate is assumed to be PET, the Si film has a thickness of 1000Å, and the laser pulse is 35 ns duration. The temperature of the $SiO_2$/PET interface is plotted versus time for several different thicknesses of $SiO_2$, as illustrated in FIG. 2. Thus, it is seen that the thicker the film the better the protection of the plastic substrate and a 5.0 μm $SiO_2$ film provides the best thermal protection for the plastic substrate; a peak temperature of less than 200° C., resulting in a no/minimal damage to the plastic substrate.

Figure 3:
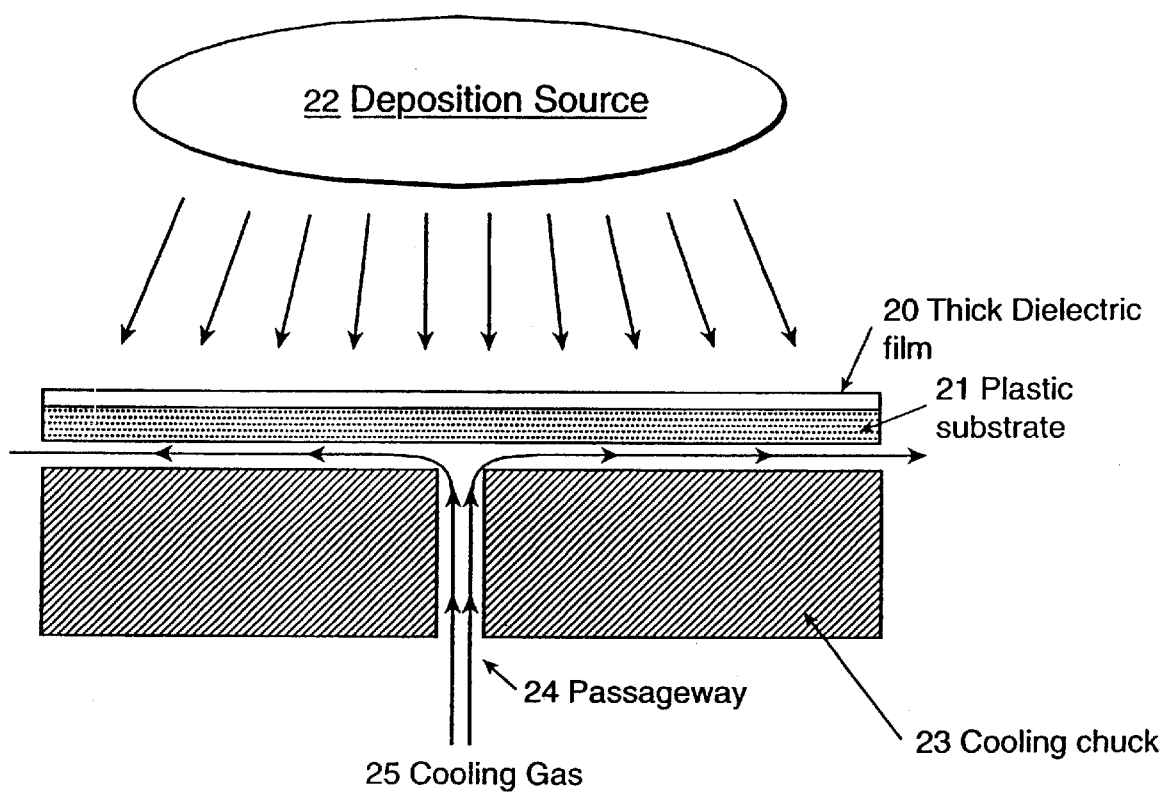
FIG. 3 schematically illustrates the implementation of the process for deposition of the thermal barrier of FIG. 1, for example, utilizing substrate cooling in accordance with the present invention.

FIG. 3 schematically illustrates the method of the present invention in its general form, and an apparatus for carrying out the method. As shown, a thermal barrier layer or thick dielectric film 20 is deposited on a plastic substrate 21, as indicated by the arrows, using any of a variety of deposition sources indicated at 22. The source 22 may include, but is not limited to: plasma CVD using RF, DC, ECR or Helicon plasma sources; thermal CVD; evaporation, sputtering and reactive sputtering. The dielectric film 20 may include, but is not limited to: silicon oxide, silicon nitride, silicon oxynitride, silicon carbide, a metal oxide (e.g., $Al_2O_3$, MgO, etc.), amorphous silicon, amorphous germanium, etc. During deposition of the thick dielectric film 20 the plastic substrate 21 is maintained at or below room temperature. To cool the plastic substrate 21, it is placed near, or in contact with a cooling chuck or holder 23. The cooling can be greatly enhanced by maintaining a pressure of gas between the plastic substrate 21 and the cooling chuck 23. This gas increases the thermal transfer between the chuck and the substrate. To accomplish this at least one centrally located opening or passageway 24 is located in the cooling chuck 23 and connected to a pressurized gas supply, not shown. The gas 25 is introduced through the passageway 24 and passes outwardly between the chuck 23 and the plastic substrate 21, as indicated by the arrows. The gas 25 can be any gas that does not significantly disturb the deposition process, and may, for example, be He, Ar, $N_2$, etc.

Figure 4:
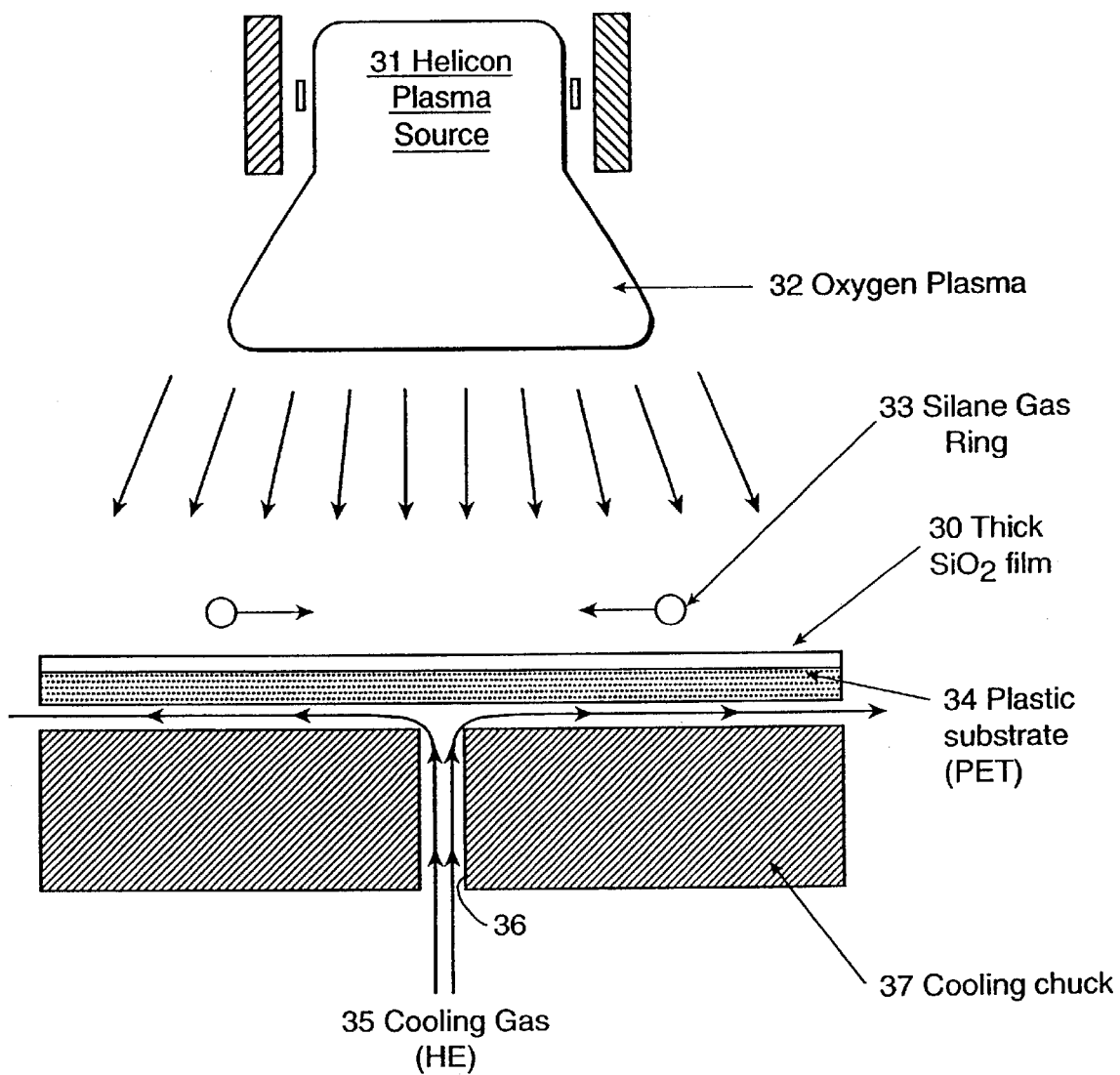
FIG. 4 schematically illustrates an embodiment of the apparatus and process for implementation of depositing the thermal barrier in accordance with the present invention.

The present invention has been implemented by a specific embodiment illustrated in FIG. 4. Here a thick (~3 $\mu$m) film of $SiO_2$ 30 was deposited using a helicon plasma source 31. The source generates an oxygen plasma 32. $SiH_4$ (silane) gas was introduced using a gas ring 33 located near the surface of a plastic (PET) substrate 34. This resulted in the $SiO_2$ film 30 deposit on the plastic substrate 34. Helium gas 35 was introduced, as indicated by the arrows, from a hole or passageway 36 in a cooling chuck 37. The He gas 35 passing outwardly between the plastic substrate 34 and the chuck 37 provided thermal transfer between the substrate and the chuck. A thick $SiO_2$ film, formed as shown in FIG. 4, was tested by immersion in water for 15 minutes and heating to 100° C. for 20 minutes, with no cracking or delamination of the film. The film was then tested as a thermal barrier, between a silicon film and a plastic substrate for use in pulsed laser annealing of silicon, and only a few cracks occurred in the film at the most extreme laser annealing conditions (50 pulses at each location). No damage to the plastic substrate occurred as the result of the laser annealing of the silicon film.

It has thus been shown that the present invention provides a method for depositing thick adherent dielectric films on plastic substrates which function effectively as protective thermal barriers, having on top of a thermal barrier a silicon film, for example, that undergoes laser melting (at temperatures ~1400° C.) without damage to the substrate. This is accomplished by maintaining the plastic substrate at or below room temperature during deposition of the 1–5 $\mu$m thick barrier layer on the plastic substrate. The barrier layer satisfies the above-referenced need in the art by providing the following properties:
1. Thicknesses of 1 $\mu$m or greater.
2. Adheres to plastic substrates.
3. Does not lift-off when cycled in temperature.
4. Has no significant cracks and does not crack when subject to bending.
5. Resistant to lift-off when submersed in fluids.
6. Electrically insulating.
7. Preferably transparent.

Thick adherent dielectric films or thermal barrier layers are critical for the fabrication of electronics on plastic substrates, particularly where light-weight electronics are desired, such as for use in portable battlefield operations. Further electronics on plastic is desired for constructing large-area, light-weight, rugged displays used for flight simulators, tank and ship interior operations, portable systems such as GPS systems or electronic mapping/communications.

Thick (1–5 $\mu$m) adherent dielectric films or plastic can also be used as:
1. A thermal barrier to protect plastics from high temperatures during pulsed laser or other similar pulsed energy processes.
2. A permeation barrier to prevent or reduce diffusion of impurities between the plastic and another layer, or between two layers. One specific application would be as a permeation barrier between a plastic substrate and a layer of organic light emitting diodes (OLEDs). It is well known that OLEDs deteriorate from the outgassing of water and other impurities from the substrate. Another specific application would be as a permeation barrier between a plastic substrate and an electronic device (e.g., transistor).
3. A layer to reduce the thermal expansion/contraction of the plastic. This is beneficial toward construction of circuits and devices on plastic for which thermal expansion/contraction can cause misalignment between patterned layers as well as cracking of subsequent layers. Thick dielectric films on the plastic constrain the thermal expansion/contraction.
4. A planarization layer. Such a layer can reduce the roughness present in a substrate. This layer can also be deposited above devices to provide a planarized surface on which other devices could be built.
5. A Scratch resistant layer.
6. An electrical isolation layer for devices, similar to a field oxide used in IC manufacturing.
7. An electrical and/or thermal isolation layer between levels of devices in a multilevel circuit.

While a particular embodiment of the apparatus and method of the invention have been illustrated and described, along with particular materials, such are not intended to be limiting. Modifications and changes may become apparent to those skilled in the art, and it is intended that the invention be limited only by the scope of the appended claims.

What is claimed is:

1. In a method for depositing protective adherent dielectric films on a plastic substrate incapable of withstanding temperatures of above about 200° C. for a sustained time period, the improvement comprising:
   maintaining the plastic substrate at or below room temperature during deposition.

2. The improvement of claim 1, wherein the temperature is maintained by positioning the plastic substrate on a cooling chuck.

3. The improvement of claim 2, additionally including supplying a gas intermediate the cooling chuck and the plastic substrate.

4. The improvement of claim 3, additionally including selecting the gas from the group consisting of He, Ar, $N_2$, and other gases which do not significantly disturb the deposition process.

5. The improvement of claim 2, additionally providing at least one opening in the cooling chuck, and directing a gas through the at least one opening and intermediate the plastic substrate and an adjacent surface of the cooling chuck.

6. The improvement of claim 5, additionally including selecting the gas from the group consisting of He, Ar, $N_2$.

7. The improvement of claim 1, additionally including depositing the adherent dielectric films to a thickness in the range of 1 $\mu$m to about 5 $\mu$m.

8. The improvement of claim 1, additionally including depositing the adherent dielectric film from a material selected from the group consisting of silicon oxide, silicon nitride, silicon oxynitride, silicon carbide, metal oxides, amorphous silicon, and amorphous germanium.

9. The improvement of claim 8, wherein the material selected is silicon oxide and is deposited to a thickness of at least 1 $\mu$m.

10. The improvement of claim 1, additionally including selecting the plastic substrate from the group consisting of PET, PEN, and KAPTON.

11. The improvement of claim 1, additionally including depositing the adherent dielectric film by deposition techniques selected from the group consisting of plasma CVD using RF, DC, ECR, and Helicon plasma sources, thermal CVD, evaporation, sputtering, and reactive sputtering.

12. A method for depositing at least 1 μm thick protective adherent dielectric films on plastic substrates, comprising:

maintaining the plastic substrate at about room temperature, and using a material source method to form a film of material on a surface of the plastic substrate.

13. The method of claim 12, wherein maintaining the plastic substrate at about room temperature is carried out by placing the substrate on a cooled substrate holder.

14. The method of claim 13, additionally including directing a cooling gas intermediate the substrate and the cooling substrate holder.

15. The method of claim 12, wherein the material source method is selected from the group of evaporation, sputtering, reactive sputtering, or PEcup using ECR, helicon, rf, dc or arc-jet plasma sources.

16. The method of claim 15, wherein a plasma is directed toward the substrate and deposition material.

17. The method of claim 16, wherein additionally a source material is introduced either as a gas or by evaporation or sputtering, and the source material reacts with the plasma, thereon to produce an adherent film selected from the group consisting of $SiO_x$, $SiN_x$, $SiC_x$, $SiN_xO_y$, $Al_2O_3$, and MgO.

* * * * *